(12) United States Patent
Hamada et al.

(10) Patent No.: US 11,239,798 B2
(45) Date of Patent: Feb. 1, 2022

(54) DISTRIBUTION MIXER

(71) Applicant: Nippon Telegraph and Telephone Corporation, Tokyo (JP)

(72) Inventors: Hiroshi Hamada, Tokyo (JP); Teruo Jo, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/976,939

(22) PCT Filed: Feb. 21, 2019

(86) PCT No.: PCT/JP2019/006469
§ 371 (c)(1),
(2) Date: Aug. 31, 2020

(87) PCT Pub. No.: WO2019/181345
PCT Pub. Date: Sep. 26, 2019

(65) Prior Publication Data
US 2020/0395893 A1 Dec. 17, 2020

(30) Foreign Application Priority Data
Mar. 19, 2018 (JP) .............................. JP2018-050704

(51) Int. Cl.
  *H03D 9/06* (2006.01)
  *H03D 7/14* (2006.01)
  *H03D 7/12* (2006.01)
(52) U.S. Cl.
  CPC .......... *H03D 9/0675* (2013.01); *H03D 7/125* (2013.01); *H03D 7/1441* (2013.01);
  (Continued)

(58) Field of Classification Search
  CPC .... H03D 7/125; H03D 7/1441; H03D 9/0675; H03D 7/1466; H03D 2200/0043; H03D 2200/0076; H03D 2200/0074; H03F 3/607
  See application file for complete search history.

(56) References Cited

U.S. PATENT DOCUMENTS 4,751,744 A * 6/1988 Pavio, Jr. ............. H03D 9/0675
  330/54
5,486,787 A  1/1996 Maekawa et al.
(Continued)

FOREIGN PATENT DOCUMENTS

| JP | H0294908 A | 4/1990 |
|----|------------|--------|
| JP | H06276029  | 9/1994 |
| JP | 2012507956 | 3/2012 |
| JP | 201543499  | 3/2015 |

OTHER PUBLICATIONS

Nie, Boyu, Jinfang Zhou, and Kangsheng Chen. "Design and analysis of an ultrawide-band distributed drain-pumped mixer using 0.18 μm CMOS technology." 2009 Asia Pacific Conference on Postgraduate Research in Microelectronics & Electronics (PrimeAsia). IEEE, 2009. (Year: 2009).*

(Continued)

*Primary Examiner* — Ryan Johnson
(74) *Attorney, Agent, or Firm* — Slater Matsil, LLP

(57) ABSTRACT

A distributed mixer is configured of an artificial transmission line of which an input end is connected to an LO terminal and a terminal end is connected to an IF terminal, an artificial transmission line of which an input end is connected to an RF terminal, FETs that perform frequency synthesis of LO signals and RF signals and that are disposed following the artificial transmission lines and of which gates are connected to the artificial transmission line and sources are grounded, a bias circuit that applies gate bias voltage to a terminal end of the artificial transmission line, a terminat- (Continued)

ing resistor that connects the terminal end of the artificial transmission line and a ground, and a plurality of transmission lines provided between the artificial transmission line and a drain of each FET.

16 Claims, 13 Drawing Sheets

(52) U.S. Cl.
CPC ... *H03D 7/1466* (2013.01); *H03D 2200/0017* (2013.01); *H03D 2200/0043* (2013.01); *H03D 2200/0076* (2013.01)

(56) References Cited

U.S. PATENT DOCUMENTS

| | | | |
|---|---|---|---|
| 7,279,980 B2 * | 10/2007 | Heydari | H03F 3/604 330/286 |
| 2005/0064840 A1 * | 3/2005 | Heydari | H03D 7/1441 455/323 |
| 2010/0144290 A1 | 6/2010 | Khatri et al. | |

OTHER PUBLICATIONS

Deng, Kuo-Liang, et al., "A 3.33 GHz PHEMT MMIC Distributed Mixer", Radio Frequency Integrated Circuits (RFIC) Symposium, Jun. 2, 2002, pp. 151-154 (Year: 2002).*

Bura, P., et al., "F.E.T. Mixer with the Drain L.O. Injection," Electronics Letters, Sep. 30, 1976, pp. 536-537, vol. 12, No. 20.

* cited by examiner

DISTRIBUTION MIXER

CROSS-REFERENCE TO RELATED APPLICATIONS

This application is a national phase entry of PCT Application No. PCT/JP2019/006469, filed on Feb. 21, 2019, which claims priority to Japanese Application No. 2018-050704 filed on Mar. 19, 2018, which applications are hereby incorporated herein by reference.

TECHNICAL FIELD

The present invention relates to circuit technology that handles radio frequency electrical signals, and in particular to a mixer that has frequency conversion functions

BACKGROUND

A distributed mixer is a mixer circuit that forms an artificial transmission line using a reactance component that a field-effect transistor (FET) has and a reactance component that a transmission line has, and realizes broadband characteristics by using broad frequency characteristics that the artificial transmission line has (see NPL 1).

It is important in distributed mixers that design of bias circuits be made without losing the broadband nature of the artificial transmission line. In the case of a mixer with a lumped-element design, the radio frequency (RF (Radio Frequency)) terminal, the terminals of local oscillator (LO (Local Oscillator)) terminal, and intermediate frequency (IF (Intermediate Frequency)) terminal are normally designed to a narrow band and accordingly bias can be supplied using a ¼-wavelength stub where impedance is sufficiently height at a desired frequency, for example.

However, artificial transmission lines can only be formed in distributed mixers within a frequency range where impedance of the ¼-wavelength stub appears to be sufficiently greater than characteristic impedance of the artificial transmission line, and as a result, the broadband nature of the distributed mixer is impaired. Idealistically, this problem can be solved by using a choke coil where impedance is sufficiently great within the broadband frequency range of the artificial transmission line. However, creating a coil having a large inductance value in a MMIC (Monolithic Microwave Integrated Circuit) is difficult, and is not practical.

Accordingly, in the case of distributed mixers, a bias circuit having high resistance, such as illustrated in FIG. 13, is normally used. The example shown in FIG. 13 is an example of a drain injection distributed mixer where conversion gain is great, and securing isolation between RF frequency and LO frequency is easy (see NPL 2). The drain injection distributed mixer is configured of artificial transmission lines 1 and 2, a plurality of FETs Q1 that are unit mixers arrayed along the artificial transmission lines 1 and 2, a bias circuit 3 that applies drain bias voltage to the input end of the artificial transmission line 1, a bias circuit 4 that applies gate bias voltage to the terminal end of the artificial transmission line 2, a capacitor C1 that connects the input end of the artificial transmission line 1 and an LO terminal 5, a capacitor C2 that connects the input end of the artificial transmission line 2 and an RF terminal 6, a capacitor C3 that connects the terminal end of the artificial transmission line 1 and an IF terminal 7, a terminating resistor R1 that connects the terminal end of the artificial transmission line 2 and a ground, and transmission lines CPW3 provided between the artificial transmission line 1 and the drains of the FETs Q1.

The artificial transmission line 1 is configured of a plurality of transmission lines CPW1 that have been serially connected, and the artificial transmission line 2 is configured of a plurality of transmission lines CPW2 that have been serially connected.

The bias circuit 3 applies drain bias voltage Vdd to the artificial transmission line 1 via a resistor Rdd. The bias circuit 4 applies gate bias voltage Vg to the artificial transmission line 2 via a resistor Rg.

The resistors Rdd and Rg are elements that have no frequency dependency, and if the values of the resistors Rdd and Rg are made to be sufficiently greater than the characteristic impedance of the artificial transmission lines 1 and 2, bias application can be performed without losing the broadband nature of the artificial transmission lines 1 and 2. However, in a case of using high resistance, a bias voltage of a magnitude corresponding to the voltage drop at the resistors Rdd and Rg needs to be externally supplied.

In a case of designing a drain injection distributed mixer, design of a bias circuit using high resistance incurs the difficulty which will be described next regarding the bias circuit 3 to which drain bias voltage Vdd is applied, in particular. The drain bias voltage Vdd needs to be voltage of a magnitude corresponding to the magnitude of voltage drop at the high resistor Rdd, as described above. For example, in a case of setting the drain voltage of the FETs Q1 near knee voltage, drain current approximately equal to the saturation region flows to each of the FETs Q1 making up the unit mixers.

In the case of a drain injection distributed mixer, current that is the drain current flowing to each of the unit mixers multiplied by the number of cascade stages of mixers (multiplied by the number of FETs Q1) flows to the high resistor Rdd that makes up the bias circuit 3, so the voltage drop at the high resistor Rdd is great. For example, in a case of using InP-HEMTs (High Electron Mobility Transistor) having a gate width of 10 µm as the FETs Q1 in a state where gate voltage is −0.2 V, the drain current near the drain voltage 0.2 V that is the knee voltage will be around 4 mA.

Accordingly, in a case where the drain injection distributed mixer is to have a configuration with eight cascade stages, for example, current of 32 mA flows to the high resistor Rdd. The resistance value of the high resistor Rdd needs to be sufficiently greater than the characteristic impedance of the artificial transmission lines 1 and 2 (normally 50Ω, and accordingly if this is set to 500Ω for example, the voltage drop at the high resistor Rdd will be 1.6 V. Accordingly, the drain bias Vdd supplied to the bias circuit 3 needs to be 1.8 V in order to set the drain voltage of the FETs Q1 to near the knee voltage.

In a drain injection distributed mixer, LO signals and RF signals are mixed, or LO signals and IF signals are mixed by turning the FETs Q1 on/off, and changing the drain current. In doing so, at the instant of the FETs Q1 going off and drain current stops flowing, the voltage drop at the high resistor Rdd becomes small, and as a result, the drain bias voltage Vdd=1.8 V is applied as it is to the drains of the FETs Q1. This voltage is a value barely within the drain breakdown voltage of a normal FET. In order to lower the voltage applied to the drains of the FETs Q1 when off, the voltage drop at the high resistor Rdd needs to be reduced. This can be conceivably done by reducing the number of cascade stages of the FETs Q1 and reduce the value of the current flowing to the high resistor Rdd, or making the value of the high resistor Rdd to be smaller.

In a drain injection distributed mixer, conversion gain is proportionate to the number of cascade stages of the FETs Q1, so high conversion gain cannot be secured with the technique of reducing the number of cascade stages of the FETs Q1. Also, with the technique of making the value of the resistor Rdd to be smaller, the smaller the value of the resistor Rdd is the more non-negligible the presence of the bias circuit 3 as viewed from the artificial transmission lines 1 and 2 of the distributed mixer becomes, as described above, so the broadband nature of the distributed mixer is lost.

There has also been a problem that usage efficiency of the power source is extremely poor at the bias circuits 3 and 4 that use the high resistors Rdd and Rg, and electric power consumption at the high resistors Rdd and Rg is great.

CITATION LIST

Non Patent Literature

[NPL 1] Kuo-Liang Deng, Hue Wang, "A 3-33 GHz PHEMT MMIC Distributed Drain Mixer", Radio Frequency Integrated Circuits (RFIC) Symposium, 2002, IEEE

[NPL 2] P. Bura, R. Dikshit, "F.E.T. mixer with the drain L. O. injection", Electronics Letters 30 Sep. 1976, Vol. 12, No. 20

SUMMARY

Technical Problem

The present invention has been made to solve the above problem, and it is an object thereof to provide a distributed mixer where broadband nature and high conversion gain can be secured, and electric power consumption can be reduced.

Means for Solving the Problem

A distributed mixer according to embodiments of the present invention includes a first transmission line of which an input end is connected to an LO terminal for LO signal input, and a terminal end is connected to an IF terminal for IF signal output, a second transmission line of which an input end is connected to an RF terminal for RF signal input, a plurality of transistors that are disposed between the first and second transmission lines and arrayed equidistantly following the direction of flow of signals of these transmission lines, and of which gates are connected to the second transmission line, drains are connected to the first transmission line, and sources are grounded, a bias circuit that applies bias voltage to a terminal end of the second transmission line, and a terminating resistor that connects the terminal end of the second transmission line and a ground. The bias circuit applies the bias voltage so that a direct current voltage between the gate and source of the plurality of transistors is the threshold voltage of these transistors. The direct current voltage between the drain and source of the plurality of transistors is equal. The IF signals obtained by performing frequency conversion of the RF signals are output from a terminal end of the first transmission line.

Also, a distributed mixer according to embodiments of the present invention includes a first transmission line of which an input end is connected to an LO terminal for LO signal input, and a terminal end is connected to an RF terminal for RF signal output, a second transmission line of which an input end is connected to an IF terminal for IF signal input, a plurality of transistors that are disposed between the first and second transmission lines and arrayed equidistantly following the direction of flow of signals of these transmission lines, and of which gates are connected to the second transmission line, drains are connected to the first transmission line, and sources are grounded, a bias circuit that applies bias voltage to a terminal end of the second transmission line, and a terminating resistor that connects the terminal end of the second transmission line and a ground. The bias circuit applies the bias voltage so that a direct current voltage between the gate and source of the plurality of transistors is the threshold voltage of these transistors. The direct current voltage between the drain and source of the plurality of transistors is equal. The RF signals obtained by performing frequency conversion of the IF signals are output from a terminal end of the first transmission line.

Also, one configuration example of the distributed mixer according to embodiments of the present invention further includes a plurality of third transmission lines inserted between the first transmission line and drains of the plurality of transistors.

Also, in one configuration example of the distributed mixer according to embodiments of the present invention, the first transmission line is a transmission line having a differential configuration, composed of a first transmission line at a positive phase side of which an input end is connected to an LO terminal at the positive phase side and a terminal end is connected to an IF terminal at the positive phase side, and a first transmission line at a negative phase side of which an input end is connected to an LO terminal at the negative phase side and a terminal end is connected to an IF terminal at the negative phase side. The second transmission line is a transmission line having a differential configuration, composed of a second transmission line at a positive phase side of which an input end is connected to an RF terminal at the positive phase side, and a second transmission line at a negative phase side of which an input end is connected to an RF terminal at the negative phase side. The transistors are transistors having differential configurations, composed of transistors at the positive phase side of which gates are connected to the second transmission line at the positive phase side, drains are connected to the first transmission line at the positive phase side, and sources are grounded, and transistors at the negative phase side of which gates are connected to the second transmission line at the negative phase side, drains are connected to the first transmission line at the negative phase side, and sources are grounded. The terminating resistor is composed of a terminating resistor at the positive phase side that connects the terminal end of the second transmission line at the positive phase side and the ground, and a terminating resistor at the negative phase side that connects the terminal end of the second transmission line at the negative phase side and the ground. The bias circuit applies bias voltage to the terminal end of each second transmission line at the positive phase side and the negative phase side.

Also, in one configuration example of the distributed mixer according to embodiments of the present invention, the first transmission line is a transmission line having a differential configuration, composed of a first transmission line at a positive phase side of which an input end is connected to an LO terminal at the positive phase side and a terminal end is connected to an RF terminal at the positive phase side, and a first transmission line at a negative phase side of which an input end is connected to an LO terminal at the negative phase side and a terminal end is connected to an RF terminal at the negative phase side. The second transmission line is a transmission line having a differential configuration, composed of a second transmission line at a positive phase side of which an input end is connected to an IF terminal at the positive phase side, and a second transmission line at a negative phase side of which an input end is connected to an IF terminal at the negative phase side. The transistors are transistors having differential configurations, composed of transistors at the positive phase side of which gates are connected to the second transmission line at the positive phase side, drains are connected to the first transmission line at the positive phase side, and sources are grounded, and transistors at the negative phase side of which gates are connected to the second transmission line at the negative phase side, drains are connected to the first transmission line at the negative phase side, and sources are grounded. The terminating resistor is composed of a terminating resistor at the positive phase side that connects the terminal end of the second transmission line at the positive phase side and the ground, and a terminating resistor at the negative phase side that connects the terminal end of the second transmission line at the negative phase side and the ground. The bias circuit applies bias voltage to the terminal end of each second transmission line at the positive phase side and the negative phase side.

Effects of Embodiments of the Invention

According to embodiments of the present invention, the bias circuit at the drain side is unnecessary, so the difficulty of the drain-side bias circuit can be avoided. As a result, a drain injection distributed mixer where broadband nature and high conversion gain can be secured, and electric power consumption is lower than conventional arrangements, can be realized by embodiments of the present invention.

DETAILED DESCRIPTION OF ILLUSTRATIVE EMBODIMENTS

Principle of Embodiments of the Invention

Figure 1:
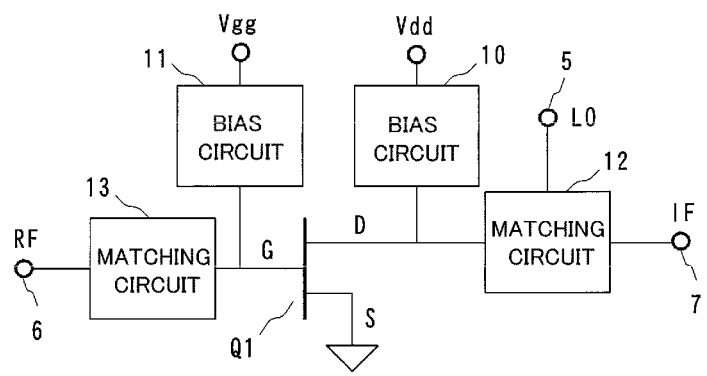
FIG. 1 is a diagram for describing the principle of a drain injection mixer.

FIG. 1 is a diagram for describing the principle of a single-ended drain injection mixer that uses one FET. The drain injection mixer is configured of a FET Q1, a bias circuit 10 that applies drain bias voltage to the drain (D) of the FET Q1, a bias circuit 11 that applies gate bias voltage to the gate (G) of the FET Q1, a matching circuit 12 that matches the impedance of the LO terminal 5 and IF terminal 7 and the impedance of the drain of the FET Q1 as viewed from the LO terminal 5 and IF terminal 7, and a matching circuit 13 that matches the impedance of the RF terminal 6 and the impedance of the gate of the FET Q1 a viewed from the RF terminal 6.

The drain injection mixer performs mixing of LO signals and RF signals or mixing of LO signals and IF signals, utilizing change in transconductance $g_m$ by modulating voltage applied to the drain of the FET Q1. Besides the knee voltage that had been thought to be the optimal bias condition for conventional drain injection mixers, a separate operation bias point where high conversion gain is obtained exists, which will be described below by way of a simple analysis model of a drain injection mixer.

Figure 2:
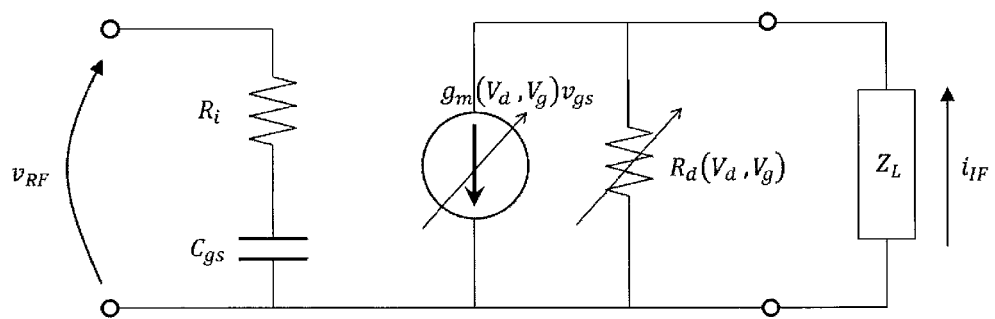
FIG. 2 is an equivalency circuit diagram of the drain injection mixer.

FIG. 2 is an equivalency circuit diagram of the drain injection mixer illustrated in FIG. 1. The operating principle of embodiments of the present invention will be described by way of this FIG. 2. There are transconductance $g_m$ and drain conductance $g_d$ of the FET Q1 as nonlinear parameters that bring about mixing operations in a drain injection mixer. These nonlinear elements are represented as current source $g_m(Vd, Vg)v_{gs}$ and drain resistance $R_d(Vd, Vg)=1/g_d$ in FIG. 2. Vd is the drain voltage of the FET Q1, and Vg is the gate voltage. Also, $v_{RF}$ in FIG. 2 is voltage of RF signals, $R_i$ is input impedance, and $C_{gs}$ is gate-source capacitance of the FET Q1. Change in the two values of transconductance $g_m$ and drain conductance $g_d$ allows IF signals generated by RF signals and LO signals being mixed to be extracted from a load $Z_L$ in FIG. 2.

Figure 3:
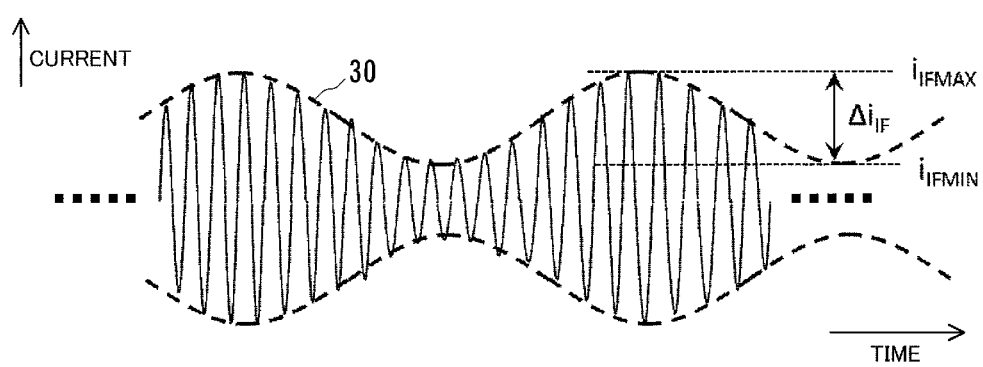
FIG. 3 is a conceptional diagram for describing frequency conversion operations of a drain injection mixer.

At this time, IF signals appear as an envelope 30 of signals generated by FR signals and LO signals being mixed, and the IF signal component alone is normally extracted using a low-pass filter, as illustrated in FIG. 3. The magnitude of conversion gain of the drain injection mixer is expressed by amount of amplitude change $\Delta i_{IF}$ of the envelope 30 in FIG. 3. That is to say, in order to increase the conversion gain of drain injection mixer, a design can be made so that the amount of change $\Delta i_{IF}$ illustrated in Formula (1) is larger.

$$\Delta i_{IF} = |i_{IFMAX} - i_{IFMIN}|$$ Formula 1

$i_{IFMAX}$ is the maximum value of amplitude of current $i_{IF}$ flowing through the load $Z_L$, and $i_{IFMIN}$ is the minimum value of amplitude. In FIG. 2, current $i_{IF}$ flowing through the load $Z_L$ is expressed by the following Formula.

Formula 2

$$i_{IF} = g_m(Vd, Vg)v_{gs} \cdot \frac{R_d(Vd, Vg)}{R_L + R_d(Vd, Vg)} = g_m(Vd, Vg)v_{gs} \cdot \frac{1}{1 + g_d(Vd, Vg)R_L} \quad (2)$$

From Formula (2), Formula (3) holds.

Formula 3

$$i_{IF} \propto \frac{g_m(Vd, Vg)}{1 + g_d(Vd, Vg)R_L} \quad (3)$$

Accordingly, the value of $\Delta i_{IF}$ that decides the conversion gain of the drain injection mixer shown in Formula (1) is proportionate to the amount of change of the absolute value of the right side of Formula (3) when the drain voltage Vd changes. The absolute value of the right side of Formula (3) is expressed as P (Vg, Vd) as in Formula (a).

Formula 4

$$P(Vg, Vd) = \left| \frac{g_m(Vd, Vg)}{1 + g_d(Vd, Vg)R_L} \right| \quad (4)$$

Figure 4:
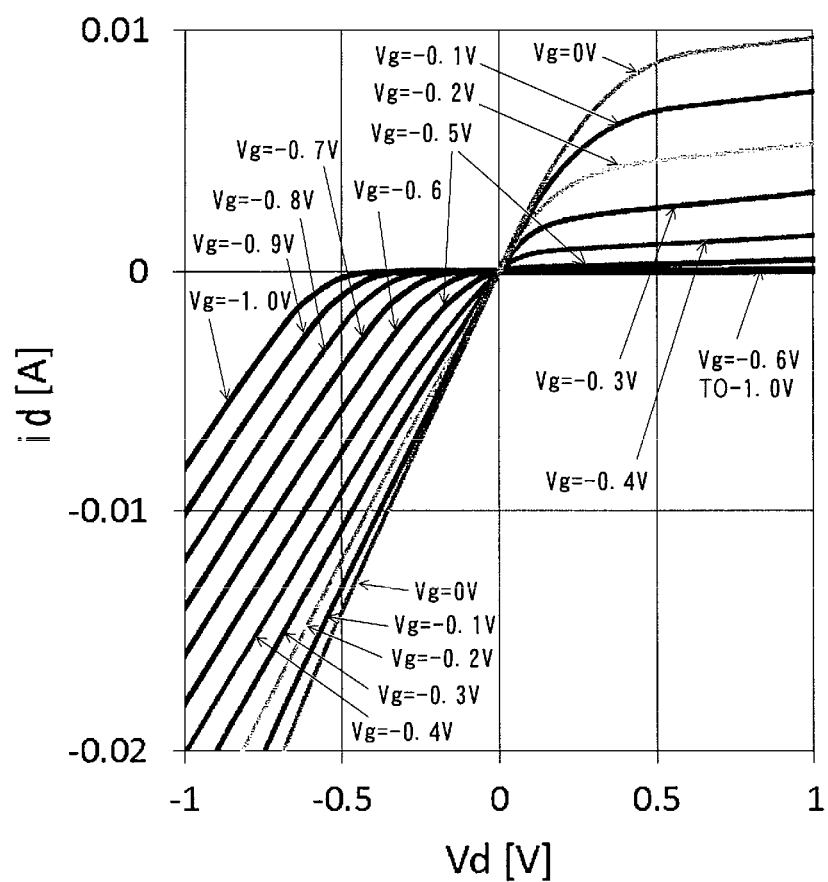
FIG. 4 is a diagram illustrating drain current-drain voltage characteristics of an FET model used for operation analysis of a drain injection mixer.

The values of transconductance $g_m$ and drain conductance $g_d$ can be obtained from current-voltage measurement of the FET Q1. When designing the drain injection mixer, the design can be made regarding a point where the amount of change of P (Vg, Vd) in Formula (4) as to the drain voltage Vd is great. A large-signal model of a MESFET with a gate width of 10 μm will be used for description of the FET Q1 here. FIG. 4 illustrates drain current id–drain voltage Vd characteristics of this FET model.

The transconductance $g_m$ and drain conductance $g_d$ of the FET model can be defined as in Formula (5) and Formula (6).

Formula 5

$$g_m = \frac{\partial i_d}{\partial v_g} \quad (5)$$

Formula 6

$$g_d = \frac{\partial i_d}{\partial v_d} \quad (6)$$

Figure 5:
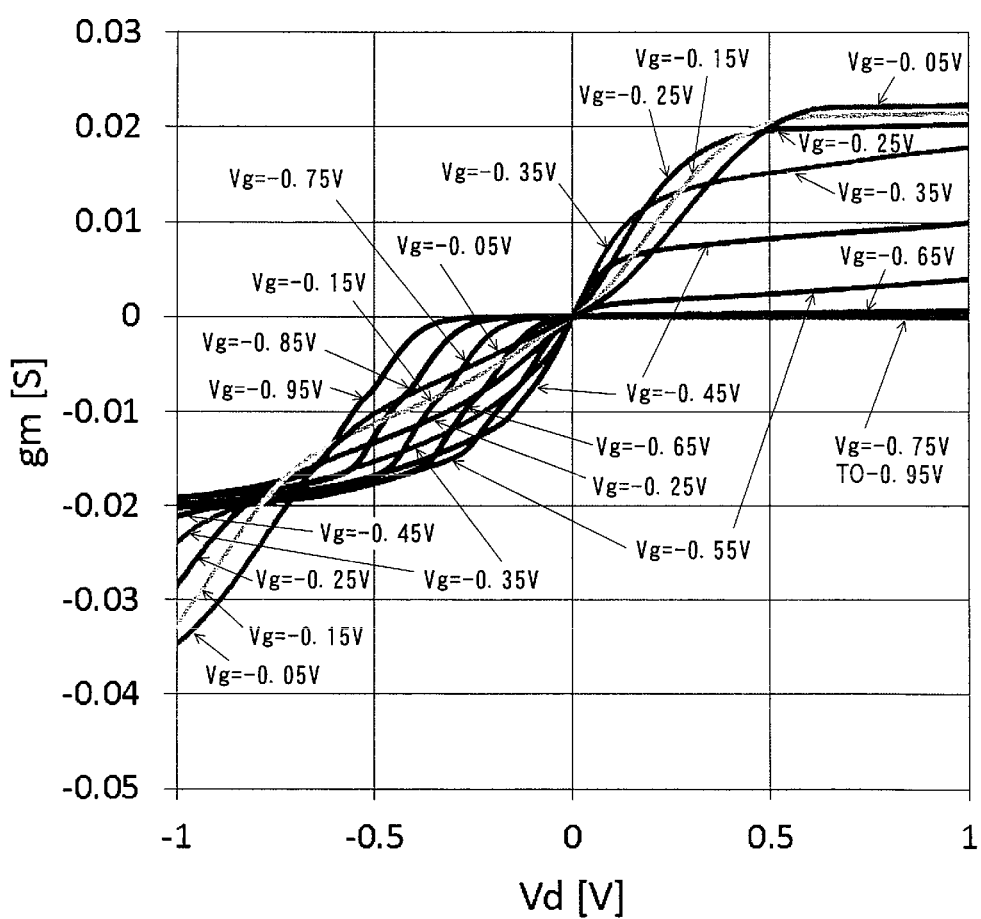
FIG. 5 is a diagram illustrating drain voltage dependency of transconductance obtained from the characteristics of the FET model illustrated in FIG. 4.
Figure 6:
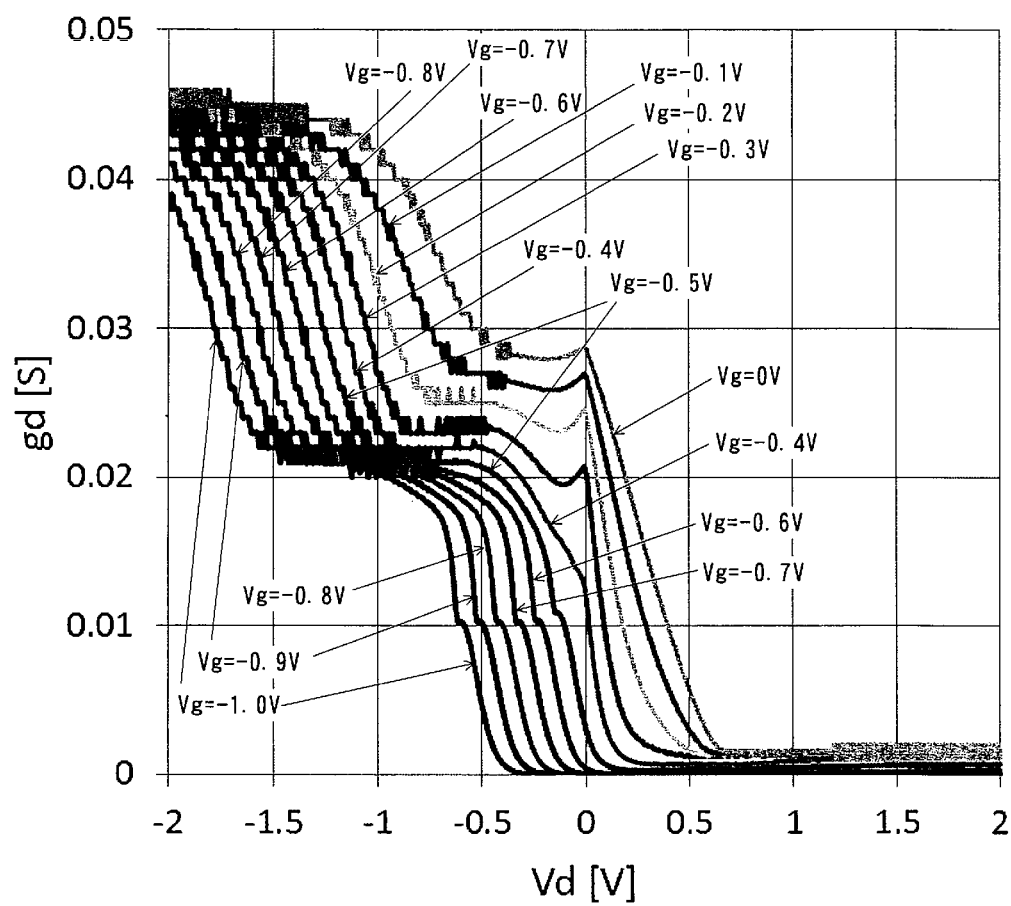
FIG. 6 is a diagram illustrating drain voltage dependency of drain conductance obtained from the characteristics of the FET model illustrated in FIG. 4.

From the characteristics in FIG. 4, calculating the drain voltage Vd dependency of the transconductance $g_m$ with gate voltage Vg as a parameter to plot on a graph yields that in FIG. 5. Also, calculating the drain voltage Vd dependency of the drain conductance $g_d$ with gate voltage Vg as a parameter to plot on a graph yields that in FIG. 6. Calculating the gate voltage Vg dependency of the P(Vg, Vd) in Formula (4) with drain voltage Vd as a parameter to plot on a graph, using the characteristics shown in FIG. 5 and FIG. 6 here, yields that in FIG. 7.

Figure 7:
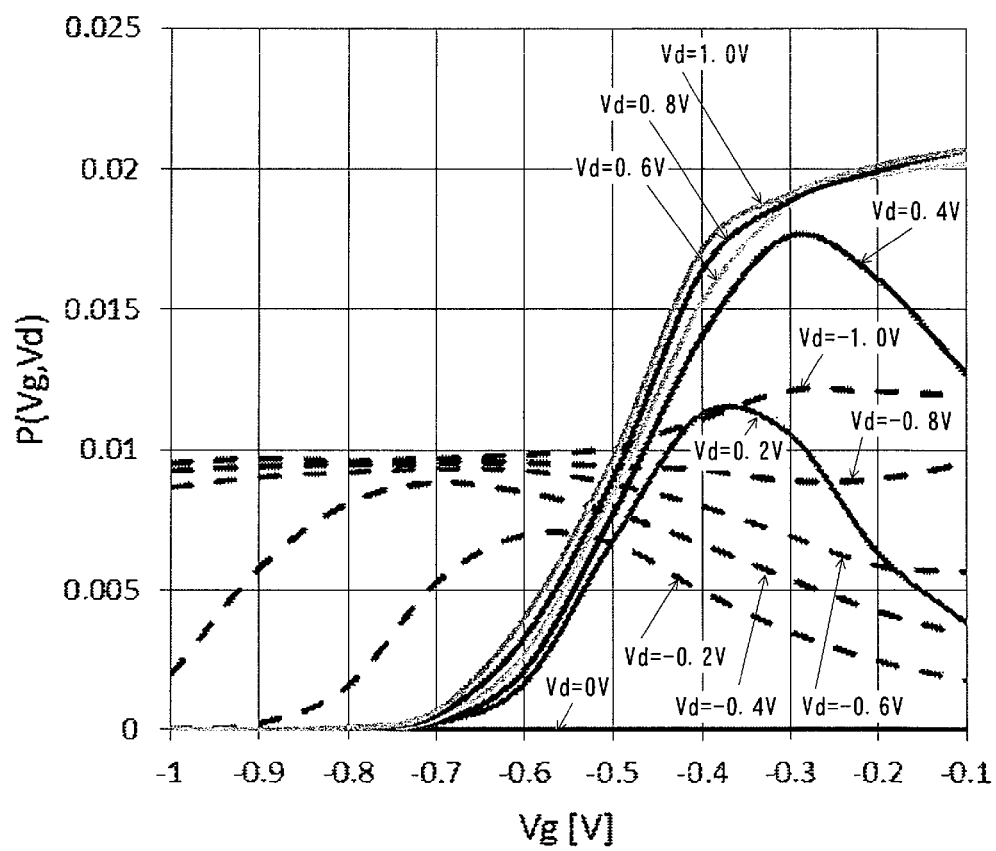
FIG. 7 is a diagram illustrating gate voltage dependency of P (Vg, Vd).

The gate voltage Vg and drain voltage Vd that optimizes conversion gain of the drain injection mixer can be derived from FIG. 7. It can be understood from FIG. 7 that the greater the gate voltage Vg is, the greater the amount of change of P(Vg, Vd) becomes. Accordingly, it is thought that the greater the gate voltage Vg is, the greater the conversion gain of the drain injection mixer is.

The drain voltage Vd is decided as follows. For example, conditions for the drain voltage Vd to increase the conversion gain of the drain injection mixer in a case where the gate voltage Vg is −0.2 V will be considered. The drain voltage Vd where the value of P(Vg, Vd) is minimal is Vd=0 V. Where the value of P(Vg, Vd) is maximal is Vd=1.0 V, however, the value of P(Vg, Vd) at that time is hardly unchanged from the cases of Vd=0.6 V and 0.8 V.

Accordingly, it is preferable to increase/reduce the drain voltage Vd in the range of 0 V to 0.6 V, in order to conserve LO signal power as well. Accordingly, the greatest conversion gain with the lowest LO signal power can be obtained by setting the drain voltage Vd to 0.3 V, which is the medium value between 0 V and 0.6 V. The (Vg, Vd)=(−0.2 V, 0.3 V) derived from the above speculation is equivalent to the knee voltage of the FET Q1, which can be understood from the drain current id–drain voltage Vd characteristics in FIG. 4. Accordingly, it can be understood that near the knee voltage, which is the bias point of conventional drain injection mixers, is optimal to obtain high conversion gain, from the index P(Vg, Vd).

Now, a case where LO signal power is even lower will be considered. Considering a case where only up to 0.2 V can be obtained as swing amplitude of the drain voltage Vd, for example, the conditions using the above-described drain voltage Vd as the bias point does not yield sufficiently large change of amount of P(Vg, Vd) as to the drain voltage Vd, and a great conversion gain cannot be obtained.

Figure 8:
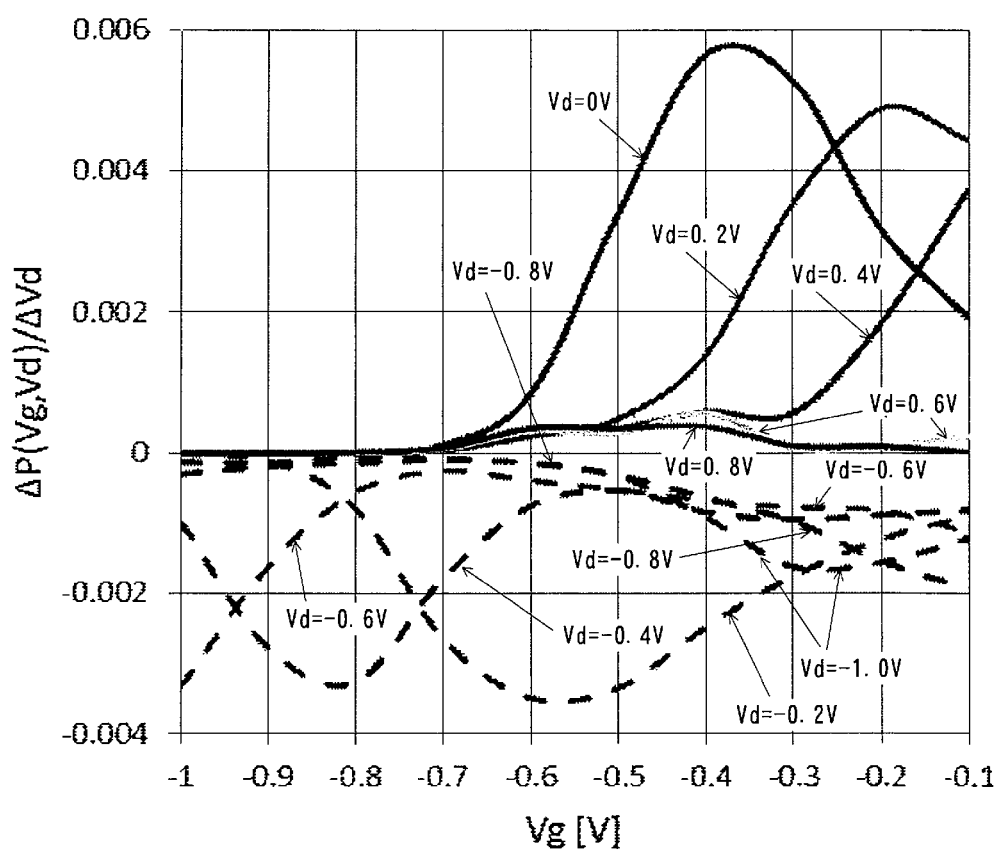
FIG. 8 is a diagram illustrating gate voltage dependency of Δ P (Vg, Vd)/Δ Vd

In order to obtain bias conditions where a great conversion gain of the drain injection mixer can be obtained with LO signal power as small as possible, the rate of change of P(Vg, Vd) as to the drain voltage Vd can be calculated as $\Delta P(Vg, Vd)/\Delta Vd$, and a bias point where this value is the greatest can be obtained. FIG. 8 illustrates gate voltage Vg dependency of $\Delta P(Vg, Vd)/\Delta Vd$ with the drain voltage Vd as a parameter.

It can be understood from FIG. 8 that $\Delta P(Vg, Vd)/\Delta Vd$ is maximal around drain voltage Vd=0 V and gate voltage Vg=−0.35 V. That is to say, high conversion gain of the drain injection mixer with the lowest LO signal power can be obtained at drain voltage Vd=0 V and gate voltage Vg= −0.35 V.

Qualitatively, the reason why $\Delta P(Vg, Vd)/\Delta Vd$ is maximal at drain voltage Vd=0 V and gate voltage Vg=−0.35 V can be explained as follows. Gate voltage Vg=−0.35 V is equivalent to the threshold voltage of the Schottky barrier junction of the gate of the FET Q1.

In a case of using the FET Q1 at drain bias voltage of 0 V, when the drain voltage Vd becomes negative voltage in accordance with LO signals, the gate voltage Vgd as viewed from the drain of the FET Q1 is greater than the threshold voltage of the Schottky barrier junction making up the gate of the FET Q1, and a large current flows from the gate to the drain.

Conversely, when the drain voltage Vd becomes positive voltage in accordance with LO signals under conditions of drain bias voltage of 0 V, Vgd becomes smaller than the threshold voltage of the Schottky barrier junction making up the gate of the FET Q1, so the current flowing from the gate to the drain rapidly drops. This indicates that the drain conductance $g_d$ rapidly changes near the origin. Also, when the drain voltage Vd becomes positive voltage, gain as to RF signals input to the gate, due to transconductance $g_m$, can also be used, as can be understood from FIG. 5.

Normally, it is assumed that mixers are driven by sufficiently great LO signal power so that the greatest conversion gain can be obtained. Accordingly, in a case where the frequency of LO signals is low and an LO signal source for great output power can be easily obtained, it is thought that the conventional use of the drain injection mixer near the knee voltage is good.

However, in a case where the LO signal frequency is extremely high, such as exceeding 100 GHz for example, the signal source that can supply sufficient LO signal power is small, so a mixer that can be driven by LO signal power that is as low as possible is desired. Embodiments of the present invention can obtain high conversion gain at low LO signal power in a case where the signal frequency is high, and accordingly is effective in, for example, a fundamental wave mixer that performs downconversion of signals where the RF signal frequency exceeds 100 GHz, or the like. Also, there is no need to supply bias voltage to the drain of the FET Q1 in embodiments of the present invention, so an advantage can be obtained in that the electric power consumption is markedly small as compared with conventional drain injection mixers.

Description has been made that, according to the above principle, even in a case where the direct current voltage of the drain of the FET Q1 is zero (the direct current voltages of the drain and source are equal), a great conversion gain can be obtained by setting the direct current voltage between the gate and source to the threshold voltage of the FET Q1. Applying this principle to a drain injection distributed mixer does away with the need for the bias circuit at the drain side, and accordingly the above-described difficulty regarding the drain-side bias circuit can be avoided, and further, a drain injection distributed mixer with lower electric power consumption than conventional arrangements can be realized.

Next, as an embodiment, a drain injection distributed mixer according to embodiments of the present invention is actually designed, calculated results are shown, and description will be made that embodiments of the present invention is effective.

FIRST EMBODIMENT

Figure 9:
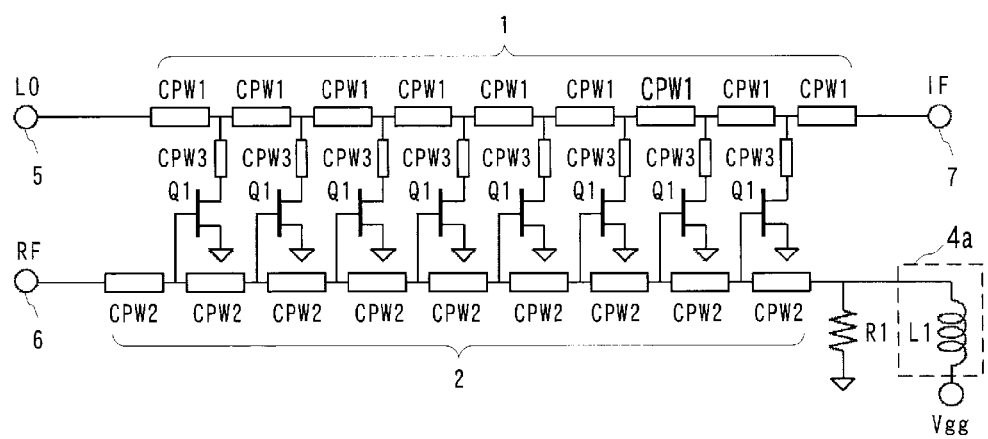
FIG. 9 is a circuit diagram illustrating a configuration of a drain injection distributed mixer according to a first embodiment of the present invention.

An example of application to a single-ended drain injection distributed mixer will be described as a first embodiment of the present invention. FIG. 9 is a circuit diagram illustrating the configuration of the drain injection distributed mixer according to the present embodiment. The drain injection distributed mixer according to the present embodiment is configured of the artificial transmission line 1 of which the input end is connected to the LO terminal 5 and the terminal end is connected to the IF terminal 7, the artificial transmission line 2 of which the input end is connected to the RF terminal 6, a plurality of FETs Q1 that are unit mixers that perform frequency synthesis of LO signals and RF signals, and that are disposed along the artificial transmission lines 1 and 2 and of which the gates are connected to the artificial transmission line 2 and the sources are grounded, a bias circuit 4a that applies gate bias voltage to the terminal end of the artificial transmission line 2, a terminating resistor R1 of 50Ω that connects the terminal end of the artificial transmission line 2 and the ground, and a plurality of transmission lines CPW3 (third transmission lines) provided between the artificial transmission line 1 and the drains of the FETs Q1.

In a case of applying embodiments of the present invention to a drain injection distributed mixer, the bias circuit at the drain side is unnecessary to begin with, so the above problem can be avoided.

In the present embodiment, identical InP-HEMTs with a gate width of 10 μm were used for all of the plurality of FETs Q1. The artificial transmission line 1 is configured of a plurality of transmission lines CPW1 (first transmission lines) that are serially connected. A coplanar line having characteristic impedance of 60Ω and 70 μm in length was used for each transmission line CPW1. In the same way, the artificial transmission line 2 is configured of a plurality of transmission lines CPW2 (second transmission lines) that are serially connected. A coplanar line having characteristic impedance of 65Ω and 70 μm in length was used for each transmission line CPW2. That is to say, the plurality of FETs Q1 are disposed equidistantly between the artificial transmission lines 1 and 2, following the direction of signals flowing over these artificial transmission lines 1 and 2 (the direction from left to right in FIG. 9).

The characteristic impedances and length of these transmission lines are values calculated so that the cutoff frequency of the artificial transmission lines 1 and 2 is a high value (a value where LO signals and RF signals can be propagated over the artificial transmission lines 1 and 2) when the drain-source voltage of the FETs Q1 is 0 V and the gate-source voltage is −0.35 V, which is the threshold voltage of the FETs Q1.

Also, a choke coil L1 having inductance of 1 H was used for the bias circuit 4a, to apply gate bias voltage to the terminal end of the artificial transmission line 2.

In a case of using the drain injection distributed mixer as a downconversion mixer as in the present embodiment, traveling waves of the RF signals and traveling waves of the LO signals are mixed at the FETs Q1 (unit mixers), and post-frequency-conversion IF signals are output from the IF terminal 7.

Figure 10:
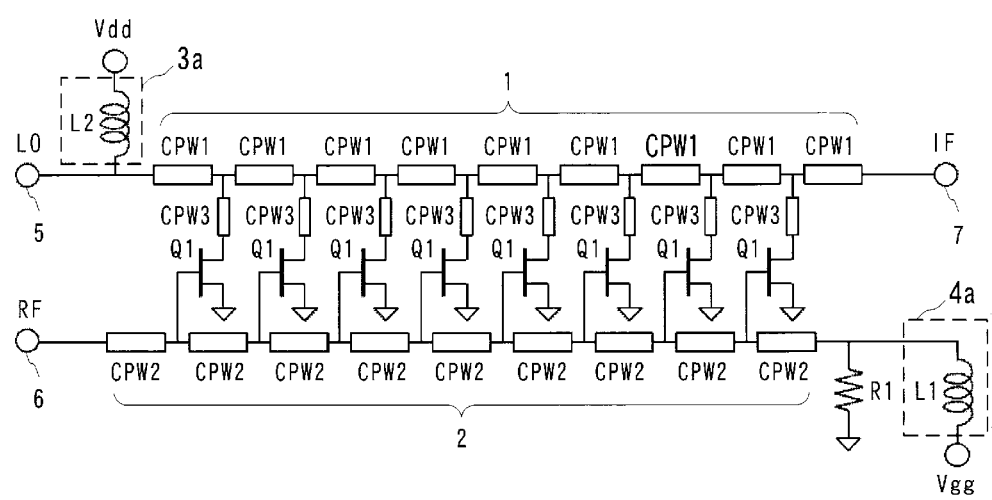
FIG. 10 is a circuit diagram illustrating a configuration of a conventional drain injection distributed mixer used for comparison with the first embodiment of the present invention.

Calculation was also performed regarding a conventional drain injection distributed mixer where bias voltage is applied to the drain of the FETs Q1, for comparison with the present embodiment. The configuration of this drain injection distributed mixer is illustrated in FIG. 10. For a bias circuit 3a that applies drain bias voltage, a choke coil L2 having inductance of 1 H was used, and the drain voltage Vd of the FETs Q1 was set to 0.2 V.

Figure 11:
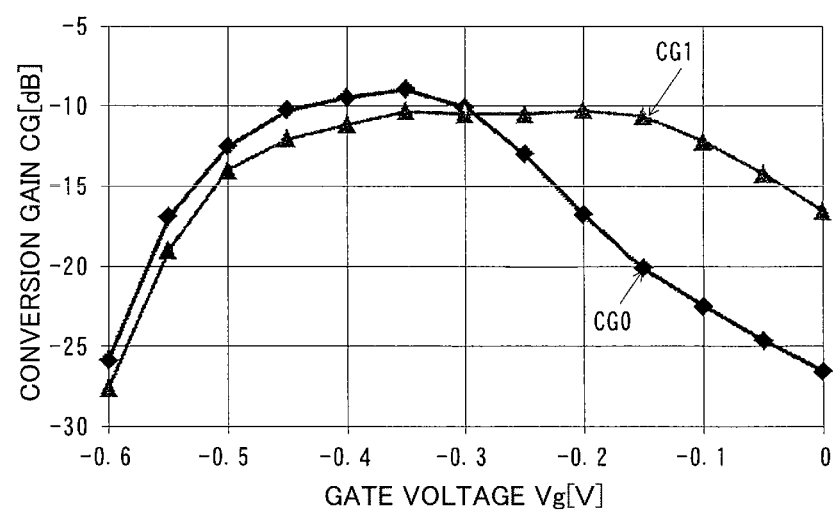
FIG. 11 is a diagram illustrating calculation results of conversion gain for the drain injection distributed mixer according to the first embodiment of the present invention and the conventional drain injection distributed mixer.

The calculation results of conversion gain CG of the drain injection distributed mixer according to the present embodiment illustrated in FIG. 9, and the conventional drain injection distributed mixer illustrated in FIG. 10, are illustrated in FIG. 11. CG0 in FIG. 11 shows the conversion gain of the drain injection distributed mixer according to the present embodiment, and CG1 shows the conversion gain of the conventional drain injection distributed mixer. The horizontal axis is the gate voltage Vg here, and drain voltage Vd is a parameter. The frequency of RF signals was set to 125 GHz, the frequency of LO signals to 119 GHz, and the frequency of IF signals to 6 GHz. Also, the power of RF signal input was set to −30 dBm, and the power of LO signal input to 4 dBm.

It can be understood from FIG. 11 that by setting the drain voltage Vd of the FETs Q1 to 0 V and the gate voltage Vg to −0.35 V, which is the threshold voltage of the FETs Q1, as in the present embodiment, yields conversion gain of −8.979 dB. It can also be understood that the conversion gain, in a case of setting the drain voltage Vd of the FETs Q1 to 0.2 V that is the knee voltage and the gate voltage Vg to −0.3 V as in the conventional drain injection distributed mixer, is −10.276 dB.

Thus, in the present embodiment, conversion gain that is higher than conventionally obtained can be obtained. The reason why high conversion gain can be thus obtained is that the amount of change of $\Delta i_{IF}$, which decides the conversion gain of the mixer, is greater under bias conditions where the drain voltage Vd is 0 V and the gate voltage Vg is the threshold voltage, than conventionally-used bias conditions, as described above in the principle of embodiments of the invention. Table 1 illustrates comparison results of electric power consumption and conversion gain for the conventional configuration and the configuration according to the present embodiment.

TABLE 1

| | Drain voltage [V] | Drain current per FET 1 [mA] | Total drain current [mA] | Drain voltage drop [V] | Drain application voltage [V] | Drain electric power consumption [mW] | Conversion gain [dB] |
| --- | --- | --- | --- | --- | --- | --- | --- |
| Conventional configuration when using L2 | 0.2 | 4.25 | 34 | 0 | 0.2 | 6.8 | −10.276 |
| Conventional configuration when using Rdd | 0.2 | 4.25 | 34 | 1.7 | 1.9 | 64.6 | −10.276 |
| Present embodiment | 0 | 0 | 0 | 0 | 0 | 0 | −8.979 |

Figure 13:
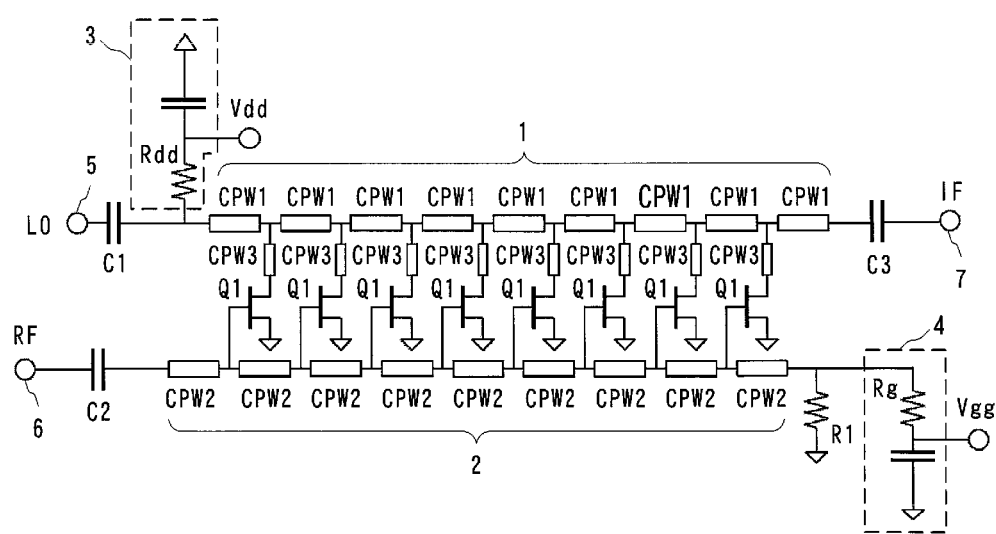
FIG. 13 is a circuit diagram illustrating a configuration of a conventional drain injection distributed mixer.

The "when using L2" in the conventional configuration shows a case of using the choke coil L2 as the bias circuit 3a, as illustrated in FIG. 10. Also, the "when using Rdd" in the conventional configuration shows a case of using the resistor Rdd of 50Ω as the bias circuit 3, as illustrated in FIG. 13. Drain voltage drop refers to voltage drop at the bias circuits 3 and 3a. Drain application voltage is the Vdd in FIG. 13 and FIG. 10.

In a configuration where the bias circuits 3 and 3a are used to apply voltage to the drains of the FETs Q1 as done conventionally, current flows to the bias circuits 3 and 3a, and accordingly electric power consumption occurs. In a case of using the bias circuit 3a, there is no direct current voltage drop at the choke coil L2, so electric power consumption can be suppressed, but it is difficult to realize a choke coil that has a great inductance value at frequencies of 100 GHz and above.

Accordingly, in reality the drains of the FETs Q1 are biased via the bias circuit 3 made up of the resistor Rdd. In a case of using the bias circuit 3, there is a need to apply a large voltage Vdd taking the voltage drop at the resistor Rdd into consideration, so electric power consumption is even greater.

Conversely, the bias voltage on the drains of the FETs Q1 is zero in the present embodiment, so the electric power consumption by the bias circuit at the drain side is zero.

SECOND EMBODIMENT

Figure 12:
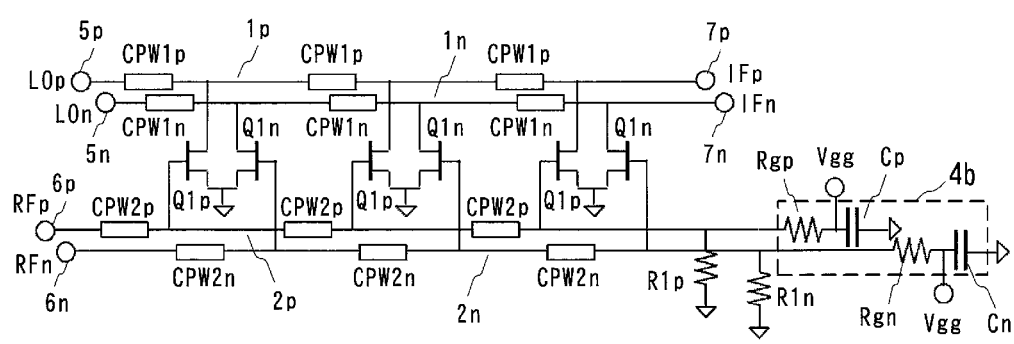
FIG. 12 is a circuit diagram illustrating a configuration of a drain injection distributed mixer according to a second embodiment of the present invention.

Next, a second embodiment of the present invention will be described. FIG. 12 is a circuit diagram illustrating a configuration of a drain injection distributed mixer according to the present embodiment. In the present embodiment, a drain injection distributed mixer of a double-balanced configuration is shown where the individual unit mixers making up the distributed mixer have a differential configuration, and further the artificial transmission line where LO signals are input and the artificial transmission line where RF signals are input both have differential configurations.

The drain injection distributed mixer according to the present embodiment is configured of an artificial transmission line 1p of which the input end is connected to an LO terminal 5p at the positive phase side and the terminal end is connected to an IF terminal 7p at the positive phase side, an artificial transmission line in of which the input end is connected to an LO terminal 5n at the negative phase side and the terminal end is connected to an IF terminal 7n at the negative phase side, an artificial transmission line 2p of which the input end is connected to an RF terminal 6p at the positive phase side, an artificial transmission line 2n of which the input end is connected to an RF terminal 6n at the negative phase side, a plurality of FETs Q1p and Q1n having differential configurations that are arrayed along the artificial transmission lines 1p, 1n, 2p, and 2n, and of which the gates are connected to the artificial transmission lines 2p and 2n and of which the drains are connected to the artificial transmission lines 1p and 1n and the sources are grounded, a bias circuit 4b that applies gate bias voltage to the terminal ends of the artificial transmission lines 2p and 2n, and terminating resistors R1p and R1n of 50Ω that connect the terminal ends of the artificial transmission lines 2p and 2n and the ground.

In FIG. 12, LOp is positive-phase-side LO signals, LOn is LO signals complementary to LOp, RFp is positive-phase-side RF signals, RFn is RF signals complementary to RFp, IFp is positive-phase-side IF signals, and IFn is IF signals complementary to IFp.

The artificial transmission line 1p is configured of a plurality of transmission lines CPW1p that are serially connected, and the artificial transmission line in is configured of a plurality of transmission lines CPW1n that are serially connected. In the same way, the artificial transmission line 2p is configured of a plurality of transmission lines CPW2p that are serially connected, and the artificial transmission line 2n is configured of a plurality of transmission lines CPW2n that are serially connected. The plurality of FETs Q1p are disposed equidistantly between the artificial transmission lines 1p and 2p, following the direction of signals flowing over these artificial transmission lines 1p and 2p, and the plurality of FETs Q1n are disposed at the same intervals as the FETs Q1p between the artificial transmission lines 1n and 2n, following the direction of signals flowing over these artificial transmission lines 1n and 2n, in the same way as in the first embodiment.

The bias circuit 4b is configured of a resistor Rgp of which one end is connected to the terminal end of the artificial transmission line 2p and drain bias voltage Vgg is applied to the other end, a resistor Rgn of which one end is connected to the terminal end of the artificial transmission line 2n and drain bias voltage Vgg is applied to the other end, a capacitor Cp of which one end is connected to the other end of the resistor Rgp and the other end is grounded, and a capacitor Cn of which one end is connected to the other end of the resistor Rgn and the other end is grounded.

In the present embodiment, the RF signals RFp and RFn that have differential configurations and the LO signals LOp and LOn that have differential configurations are mixed at the FETs Q1p and Q1n that have differential configurations, and IF signals IFp and IFn that have differential configurations are output from the IF terminals 7p and 7n.

In the present embodiment as well, the problem regarding applying drain bias that was a problem in conventional drain injection distributed mixers can be solved by the same principle as with the first embodiment. Specifically, the direct current voltage of the drains of the FETs Q1p and Q1n can be set to zero, and the gate-source direct current voltage of the FETs Q1p and Q1n can be set to the threshold voltage of the FETs Q1p and Q1n.

In a case of applying embodiments of the present invention to a balanced distributed mixer where the artificial transmission lines 1p and 1n at the drain side have been designed as a balanced type as in the present embodiment, two bias circuits are reduced at the drain side, leading to simplification of the layout as well. The present invention is also applicable to a single-balanced configuration where RF signals are single-phase input and artificial transmission line at the gate side is singular.

Note that while examples of downconversion mixers have been given in the description of the first and second embodiments, embodiments of the present invention can be applied to upconversion mixers as well. In a case of applying embodiments of the present invention to an upconversion mixer, the input ends of the artificial transmission lines 2, 2p, and 2n in FIG. 9 and FIG. 12 can be connected to the IF terminals 7, 7p, and 7n, the terminal ends of the artificial transmission lines 1, 1p, and 1n connected to the RF terminals 6, 6p, and 6n, IF signals input to the artificial transmission lines 2, 2p, and 2n instead of RF signals, and RF signals output from the terminal ends of the artificial transmission lines 1, 1p, and 1n.

INDUSTRIAL APPLICABILITY

Embodiments of the present invention can be applied to circuit technology that handles radio frequency electrical signals.

REFERENCE SIGNS LIST 1, 1p, 1n, 2, 2p, 2n Artificial transmission line
4a, 4b Bias circuit
5, 5p, 5n LO terminal
6, 6p, 6n RF terminal
7, 7p, 7n IF terminal
Q1, Q1p, Q1n FET
R1, R1p, R1n, Rgp, Rgn Resistor
L1 Choke coil
Cp, Cn Capacitor
CPW1, CPW1p, CPW1n, CPW2, CPW2p, CPW2n, CPW3 Transmission line

The invention claimed is:

1. A distributed mixer, comprising:
a first transmission line having an input end connected to a local oscillator (LO) terminal for LO signal input, wherein a terminal end of the first transmission line is connected to an intermediate frequency (IF) terminal for IF signal output;
a second transmission line having an input end connected to a radio frequency (RF) terminal for RF signal input;
a plurality of transistors between the first transmission line and the second transmission line, wherein the plurality of transistors is arrayed equidistantly in a direction of signal flow of the first transmission line and the second transmission line, wherein gates of the plurality of transistors are connected to the second transmission line, wherein drains of the plurality of transistors are connected to the first transmission line, and wherein sources of the plurality of transistors are grounded;
a bias circuit that applies a bias voltage to a terminal end of the second transmission line; and
a terminating resistor connecting the terminal end of the second transmission line to a ground, wherein the bias circuit applies the bias voltage so that a direct current voltage between a respective gate and a respective source of each of the plurality of transistors is a respective threshold voltage of a respective transistor of the plurality of transistors, wherein the direct current voltage between a respective drain and the respective source of each of the plurality of transistors is equal, and wherein the IF signal obtained by performing frequency conversion of the RF signal is output from the terminal end of the first transmission line.

2. The distributed mixer according to claim 1, further comprising a plurality of third transmission lines between the first transmission line and the drains of the plurality of transistors.

3. The distributed mixer according to claim 1, wherein:
the first transmission line has a differential configuration and comprises:
a fourth transmission line, wherein an input end of the fourth transmission line is connected to a positive phase side of the LO terminal, and wherein a terminal end of the fourth transmission line is connected to a positive phase side of the IF terminal; and
a fifth transmission line, wherein an input end of the fifth transmission line is connected to a negative phase side of the LO terminal, and wherein a terminal end of the fifth transmission line is connected to a negative phase side of the IF terminal; and
the second transmission line has a differential configuration and comprises:
a sixth transmission line, wherein an input end of the sixth transmission line is connected to a positive phase side of the RF terminal; and
a seventh transmission line, wherein an input end of the seventh transmission line is connected to a negative phase side of the RF terminal.

4. The distributed mixer according to claim 3, wherein the plurality of transistors have a differential configuration, and wherein the plurality of transistors comprise:
first transistors, wherein gates of the first transistors are connected to the sixth transmission line, wherein drains of the first transistors are connected to the fourth transmission line, and wherein sources of the first transistors are grounded; and second transistors, wherein gates of the second transistors are connected to the seventh transmission line, drains of the second transistors are connected to the fifth transmission line, and sources of the second transistors are grounded.

5. The distributed mixer according to claim 4, wherein the terminating resistor comprises:

a first terminating resistor connected between a terminal end of the sixth transmission line and the ground; and a second terminating resistor connected between a terminal end of the seventh transmission line and the ground.

6. The distributed mixer according to claim 3, wherein the bias circuit applies a bias voltage to a terminal end of the sixth transmission line and a terminal end of the seventh transmission line.

7. The distributed mixer according to claim 1, wherein the drains of the plurality of transistors are not biased by any bias circuit.

8. The distributed mixer according to claim 1, wherein the bias circuit is a choke coil.

9. A distributed mixer, comprising:

a first transmission line, wherein an input end of the first transmission line is connected to a local oscillator (LO) terminal for LO signal input, and wherein a terminal end of the first transmission line is connected to an radio frequency (RF) terminal for RF signal output;

a second transmission line, wherein an input end of the second transmission line is connected to an intermediate frequency (IF) terminal for IF signal input;

a plurality of transistors disposed between the first transmission line and the second transmission line, wherein the plurality of transistors is arrayed equidistantly in a direction of signal flow of the first transmission line and the second transmission line, wherein gates of the plurality of transistors are connected to the second transmission line, wherein drains of the plurality of transistors are connected to the first transmission line, and wherein sources of the plurality of transistors are grounded;

a bias circuit that applies a bias voltage to a terminal end of the second transmission line; and a terminating resistor that connects the terminal end of the second transmission line to a ground, wherein the bias circuit applies the bias voltage so that a direct current voltage between a respective gate and a respective source of each of the plurality of transistors is a respective threshold voltage of a respective transistor of the plurality of transistors, wherein the direct current voltage between a respective drain and the respective source of each of the plurality of transistors is equal, and wherein the RF signal obtained by performing frequency conversion of the IF signal is output from the terminal end of the first transmission line.

10. The distributed mixer according to claim 9, further comprising a plurality of third transmission lines between the first transmission line and the drains of the plurality of transistors.

11. The distributed mixer according to claim 9, wherein:

the first transmission line has a differential configuration and comprises:

a fourth transmission line, wherein an input end of the fourth transmission line is connected to a positive phase side of the LO terminal, and wherein a terminal end of the fourth transmission line is connected to a positive phase side of the RF terminal; and a fifth transmission line, wherein an input end of the fifth transmission line is connected to a negative phase side of the LO terminal, and wherein a terminal end of the fifth transmission line is connected to a negative phase side of the RF terminal; and the second transmission line has a differential configuration and comprises:

a sixth transmission line, wherein an input end of the sixth transmission line is connected to a positive phase side of the IF terminal; and a seventh transmission line, wherein an input end of the seventh transmission line is connected to a negative phase side of the IF terminal.

12. The distributed mixer according to claim 11, wherein the plurality of transistors have a differential configuration, and wherein the plurality of transistors comprise:

first transistors, wherein gates of the first transistors are connected to the sixth transmission line, wherein drains of the first transistors are connected to the fourth transmission line, and wherein sources of the first transistors are grounded; and second transistors, wherein gates of the second transistors are connected to the seventh transmission line, drains of the second transistors are connected to the fifth transmission line, and sources of the second transistors are grounded.

13. The distributed mixer according to claim 12, wherein the terminating resistor comprises:

a first terminating resistor connected between a terminal end of the sixth transmission line and the ground; and a second terminating resistor connected between a terminal end of the seventh transmission line and the ground.

14. The distributed mixer according to claim 11, wherein the bias circuit applies a bias voltage to a terminal end of the sixth transmission line and a terminal end of the seventh transmission line.

15. The distributed mixer according to claim 9, wherein the drains of the plurality of transistors are not biased by any bias circuit.

16. The distributed mixer according to claim 9, wherein the bias circuit is a choke coil.

\* \* \* \* \*